United States Patent [19]

Fiedziuszko

[11] Patent Number: 4,540,955
[45] Date of Patent: Sep. 10, 1985

[54] DUAL MODE CAVITY STABILIZED OSCILLATOR

[75] Inventor: Slawomir J. Fiedziuszko, Palo Alto, Calif.

[73] Assignee: Ford Aerospace & Communications Corporation, Detroit, Mich.

[21] Appl. No.: 480,184

[22] Filed: Mar. 28, 1983

[51] Int. Cl.³ .............................................. H03B 5/00
[52] U.S. Cl. ............................... 331/107 DP; 331/96; 331/177 R; 333/212
[58] Field of Search ............. 331/96, 107 DP, 117 D, 331/177 R; 333/212

[56] References Cited

U.S. PATENT DOCUMENTS

| | | | |
|---|---|---|---|
| 3,699,475 | 10/1972 | Rogers | 331/117 D X |
| 4,060,779 | 11/1977 | Atia et al. | 333/212 |
| 4,079,341 | 3/1978 | Linn et al. | 331/96 |
| 4,096,453 | 6/1978 | Rogers | 331/117 D |
| 4,307,352 | 12/1981 | Shinkawa et al. | 331/99 |
| 4,321,560 | 3/1982 | Nishikawa et al. | 331/99 |
| 4,325,035 | 4/1982 | Nishikawa et al. | 331/96 |
| 4,453,146 | 6/1984 | Fiedziuszko | 331/212 |

FOREIGN PATENT DOCUMENTS 54-126450  10/1979  Japan .

OTHER PUBLICATIONS

Ishihara et al., "A Highly Stabilized GaAs FET Oscillator Using a Dielectric Resonator Feedback Circuit in 9-14 GHz", IEEE Transactions on Microwave Theory and Techniques, vol. MTT-28, No. 8, Aug. 1980, pp. 817-824.
Mori et al., "A Highly Stabilized GaAs FET Oscillator Using a Dielectric Resonator Feedback Circuit in 9-14 GHz", Technology Growth for the 80's: 1980 IEEE MTT-S, International Microwave Symposium Digest, May 28-30, 1980, pp. 376-378.

Primary Examiner—Eugene R. LaRoche
Assistant Examiner—Robert J. Pascal
Attorney, Agent, or Firm—Edward J. Radlo; Robert D. Sanborn

[57] ABSTRACT

A stable electromagnetic oscillator (30) comprises an amplifying element (3) in feedback association with a dual mode resonant cavity (12) that provides a double pole bandpass filter function. Two orthogonal modes (1 and 2) of electromagnetic energy resonate within the cavity (12). An output from the amplifying element (3) excitationally couples into the first mode (1), while the second mode (2) couples into the input of the amplifying element (3). The output (8) of the oscillator (30) is obtained from the first mode (1). Optional injection lock can be used for greater stability by means of coupling a stable a.c. reference (9) into the cavity (12) in alignment with the second mode (2). Optional electronic frequency tuning comprises a phase or frequency comparator (11) and a reference a.c. source (13), producing a d.c. feedback signal fed to varactor diodes (10). Coupling ports (4, 5, 6, 7) of the cavity (12) can be, e.g., irises, capacitive probes, coaxial probes, or any combination thereof. The electrical field associated with each port (4, 5, 6, 7) is aligned with the electrical field of the mode (1 or 2) coupled thereby. A dielectric resonator (20) can be positioned within the cavity (12) to allow for physical shrinking of the cavity (12) while maintaining the electromagnetic characteristics of the cavity (12).

5 Claims, 5 Drawing Figures

DUAL MODE CAVITY STABILIZED OSCILLATOR

Description

TECHNICAL FIELD

This invention pertains to the field of electromagnetic oscillators for generating stable alternating current waveforms, particularly at microwave frequencies.

BACKGROUND ART

U.S. Pat. No. 4,096,453 uses dual modes to stabilize an oscillator. However, it differs from the present invention in that it uses transmission line resonators rather than a cavity; it uses only even and odd TEM modes, not $TE_{11p}$ and $HE_{11\delta}$ degenerative modes; and it does not suggest the use of dielectric resonator elements. The device described in this reference obtains a lower Q and lower temperature stability than the oscillator of the present invention.

Ishihara et al., "A Highly Stabilized GaAs FET Oscillator Using a Dielectric Resonator Feedback Circuit in 9-14 GHz", *IEEE Transactions on Microwave Theory and Techniques*, Vol. MTT-28, No. 8, August 1980, pp. 817-824, in FIG. 13 and accompanying description showns dielectric resonators in a dual mode feedback circuit of an oscillator. This reference differs from the present invention in that it requires two dielectric resonators rather than one; the second dielectric resonator is a band reject filter, not a bandpass filter; and both of the resonators are excited magnetically rather than electrically.

U.S. Pat. Nos. 4,079,341, 4,307,352, 4,321,560, and 4,325,035; Japanese Kokai 54-126450; and Mori et al., "A Highly Stabilized GaAs FET Oscillator Using A Dielectric Resonator Feedback Circuit in 9-14 GHz", *Technology Growth for the 80's: 1980 IEEE MTT-S, International Microwave Symposium Digest*, 28-30 May 1980, pp. 376-378, show dielectric resonators used in feedback circuits to stabilize oscillators. However, all of these references show single mode stabilization, rather than dual mode stabilization as provided by the present invention. Compared with these six references, the present invention offers better temperature compensation, improved phase noise performance, and a wider range of frequency deviation when electronic varactor tuning is used.

DISCLOSURE OF INVENTION

The oscillator (30) described herein features a cavity (12) having electrically conductive walls (40, 15), sized to accomodate two orthogonal modes (1, 2) of electromagnetic energy resonating within the cavity (12) at the desired output frequency of the oscillator (30). The cavity (12) provides two poles of bandpass filtering in a double feedback arrangement with respect to an amplifying element (3). The fact that the two modes (1, 2) are present within the same cavity (12) facilitates temperature compensation, and hence frequency stability, compared with designs in which two poles are applied separately.

An output of the amplifying element (3) is electrically coupled into the cavity (12) and becomes the first mode (1). A second, orthogonal mode (2) is provoked and controlled within the cavity (12) by means of mode perturbation means (46). The second mode (2) is coupled electrically to an input of the amplifying element (3). The desired stable a.c. waveform output (8) is extracted from the first mode (1).

Optionally, a stable a.c. reference (9) is injected into the cavity (12) in alignment with the second mode (2) to enhance the stability of the oscillator (30).

Mechanical frequency tuning can be employed, e.g., tuning screws (44, 48). When optional electronic frequency tuning is employed, a phase or frequency comparator (11) is used to compare the output (8) of the oscillator (30) with the output of a reference a.c. source (13). Phase or frequency deviation signals are then fed back to the cavity (12), where varactor diodes (10) are adjusted to tune the frequency response of the cavity (12).

An optional dielectric resonator (20) is positioned within the cavity (12) to allow the physical shrinking of the cavity (12) while preserving the electromagnetic characteristics of the cavity (12).

BRIEF DESCRIPTION OF THE DRAWINGS

These and other more detailed and specific objects and features of the present invention are more fully disclosed in the following specification, reference being had to the accompanying drawings, in which.

DETAILED DESCRIPTION OF THE PREFERRED EMBODIMENTS

Figure 1:
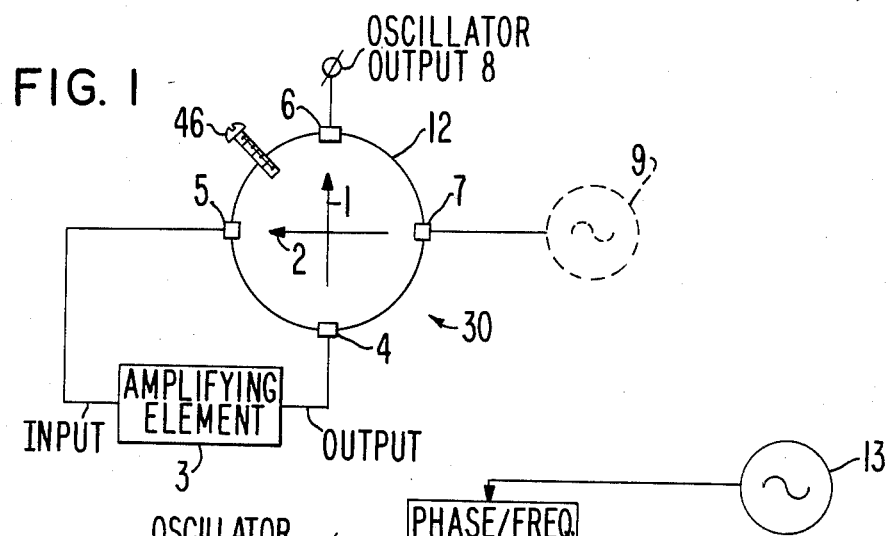
FIG. 1 is a sketch of a first embodiment of the present invention, in which optional injection lock is employed.

With regard to FIG. 1, cavity 12 provides two poles of bandpass filtering corresponding to the two orthogonal modes 1, 2 of electromagnetic energy resonating within cavity 12. The modes are designated 1 and 2 and are indicated in the Figures by arrows which represent characterizing vectors of the respective modes.

Figure 3:
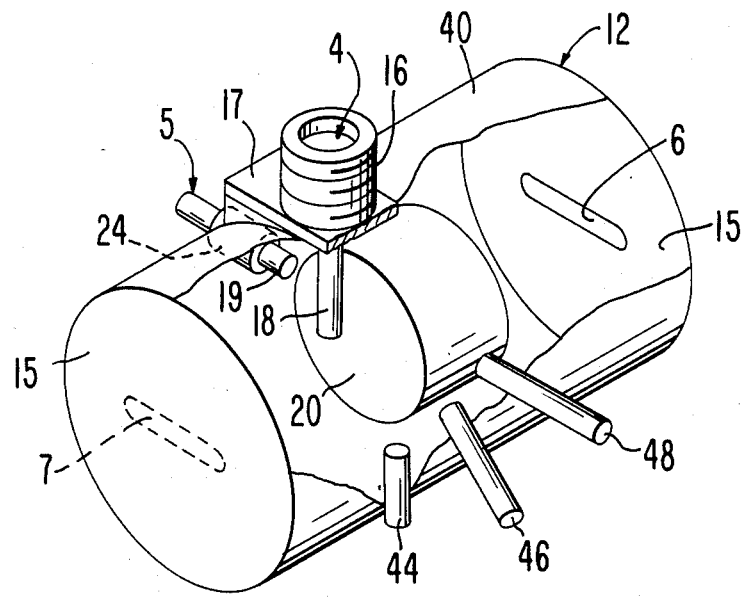
FIG. 3 is a partially broken-away perspective view of an example of a cavity 12, using mechanical frequency tuning, that is usable in the present invention.
Figure 4:
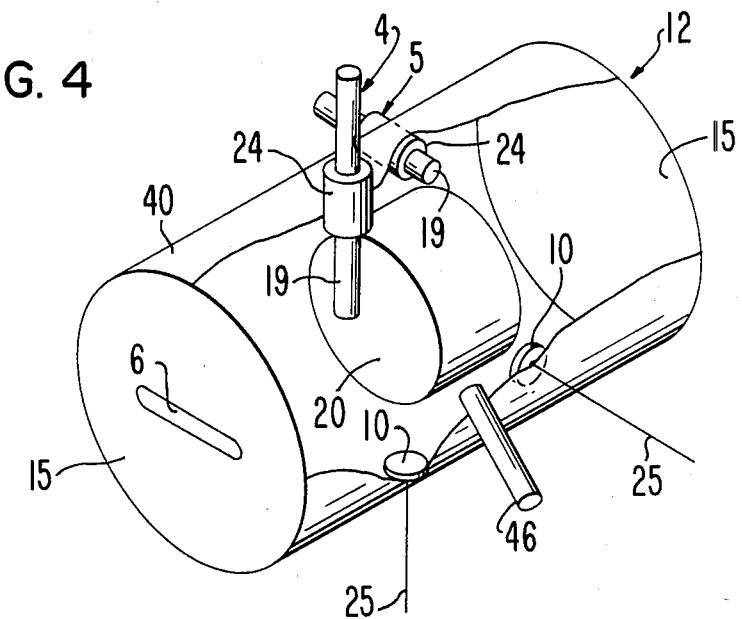
FIG. 4 is a partially broken-away perspective view of an example of a cavity 12, using electronic frequency tuning, that is usable in the present invention.

As used throughout this specification and claims, a "characterizing vector" of a mode is a vector showing the direction of the electrical field for that mode at the center of a planar cross-section of cavity 12. It is assumed that cavity 12 is generally elongated about a longitudinal axis; for example, cavity 12 may be a right-circular cylinder as depicted in FIGS. 3 and 4. The cross-section which locates a given characterizing vector is any plane that is orthogonal to this longitudinal axis. In the case where cavity 12 is a cylinder, all the characterizing vectors of a mode (representing all the possible planar cross-sections) lie in the same plane and point in the same direction.

Cavity 12 may be formed by cutting out a housing (not depicted). The housing may be a large mass of electrically conductive material to facilitate its use as an electrical ground. Alternatively, the housing may be fabricated of a lightweight dielectric material, in which case at least the inner surfaces of cavity 12 must be electrically conductive. This can be accomplished, e.g., by sputtering the inside walls of the cut-out housing with an electrically conductive substance such as silver.

Amplifying element 3, e.g., a bipolar transistor or FET operating at the desired frequency of oscillator 30, is a feedback amplifier used to provide gain to a feedback loop comprising cavity 12, coupling port 5, amplifying element 3, and coupling port 4. Amplifying element 3 typically has a broader frequency bandwidth than modes 1 and 2.

Coupling ports 4, 5, 6, and 7 provide means by which electromagnetic energy can be electrically coupled into or out of cavity 12.

Coupling port 4 is positioned along a wall of cavity 12 near the origin (tail) of a mode 1 characterizing vector. Thus, the energy coupled into cavity 12 has its electric field aligned with that of mode 1, reinforcing the propagation of mode 1 within cavity 12. Mode 1 energy is coupled out of cavity 12 via coupling port 6, positioned along a wall of cavity 12 near the termination (head) of a mode 1 characterizing vector, so that the electrical field of mode 1 is aligned with that of the energy in the transmission medium on the non-cavity side of port 6. The energy at output 8 of the oscillator 30 is a highly stabilized a.c. waveform.

Coupling port 5 is positioned along a wall of cavity 12 near the termination of a mode 2 characterizing vector, so that the electrical field of mode 2 is aligned with that of the energy within the transmission medium on the side of port 5 external to cavity 12, thereby facilitating the exit of mode 2 from cavity 12.

Reference 9 is an optional stable a.c. reference at the desired operating frequency of oscillator 30 which may be injection-lock coupled to cavity 12 to enhance the frequency stability of the oscillator 30. If employed, electromagnetic energy from reference 9 is coupled to cavity 12 via coupling port 7, located along a wall of cavity 12 near the origin of a characterizing vector of mode 2, with the electrical field from reference 9 aligned with that of mode 2.

The transmission media that connects port 5 with the input of amplifying element 3, the output of amplifying element 3 with port 4, port 6 with output 8, and optional a.c. reference 9 with port 7 can be any suitable means for conveying electromagnetic energy, e.g., microstrip, suspended substrate, coaxial cable, waveguide, or combinations thereof. Ports 4, 5, 6, and 7 are any means for electrically coupling energy into or out of cavity 12, and are selected largely based upon the type of transmission medium coupled thereby. For example, if the transmission medium is waveguide, the coupling port may be an iris. If the transmission medium is coaxial cable, the coupling port may be a coaxial probe. If the transmission medium is microstrip or suspended substrate, the coupling port may be a capacitive probe. These devices are more fully described below.

Coupling perturbation means 46 is any means, such as a dielectric or conductive screw, or notch in a wall of cavity 12, situated at an angle of 45° with respect to characterizing vectors of each of the two orthogonal modes 1, 2. Means 46 controls the degree of coupling between the two orthogonal modes 1, 2; it is more fully described below.

It is generally desired for cavity 12 to be sized so that modes 1 and 2 share a common frequency passband within the bandwidth of amplifying element 3. Precise frequency tuning can be imparted to cavity 12 by mechanical means as shown in FIG. 3, or by electronic means as shown in FIGS. 2 and 4.

Figure 2:
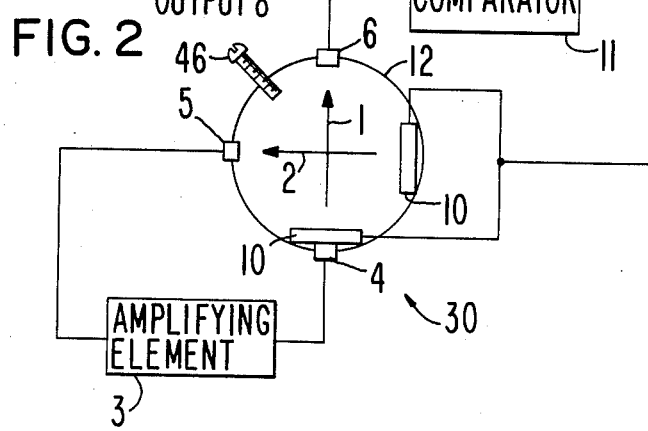
FIG. 2 is a sketch of a second embodiment of the present invention, in which electronic frequency tuning is employed.

Turning to FIG. 2, output 8 of oscillator 30 is fed as an input to comparator 11, which is a phase or frequency comparator. A reference a.c. source 13 at the desired operating frequency of the oscillator 30 is fed as a second input to phase/frequency comparator 11. Comparator 11 produces an output d.c. signal proportional to the difference in phase or frequency between output 8 of oscillator 30 and reference a.c. source 13. This d.c. signal is fed back to cavity 12 to slightly change the frequency of the energy passed by cavity 12, so that said phase or frequency difference will tend to zero. This can be accomplished, e.g., by means of varactor diodes 10 which exhibit a changing capacitance depending upon the voltage applied at the anode of the diode 10. One or more diodes 10 can be employed. If present, each is typically located just within cavity 12 near the origin of a characterizing vector, serving to adjust the frequency of the mode (1 or 2) associated with that characterizing vector. The cathode of each diode 10 is grounded to an electrically conductive wall of cavity 12.

FIGS. 3 and 4 illustrate examples of suitable configurations of cavity 12. Each Figure shows cavity 12 as a right circular cylinder having an elongated cylindrical-sleeve-shaped sidewall 40 and two circular endwalls 15. Each endwall 15 is orthogonal to sidewall 40. This geometry is beneficial for maintaining uniformity of the electrical and magnetic fields of the modes 1, 2. In the more general case, cavity 12 is elongated along an axis herein designated the "longitudinal axis", and each of two endwalls 15 connecting a sidewall 40 has a shape that remains constant when the endwall 15 is rotated in its own plane by an integral multiple of 90°.

Note that different combinations of irises, capacitive probes, and coaxial probes can be used as coupling ports 4, 5, 6, 7 on the same cavity 12. An iris is an opening connecting cavity 12 with the external transmission medium, and provides inductive coupling. A probe (coaxial or capacitive) penetrates cavity 12 and provides capacitive coupling. Probes can be used in the sidewall 40 but not in the endwalls 15. Irises can be used in the widewall 40 and in the endwalls 15. A port (4, 5, 6, or 7) situated on sidewall 40 does not have to be located at any particular longitudinal position along the sidewall 40 as long as the electrical field vector associated with the port is aligned with a characterizing vector of the mode (1 or 2) coupled thereby, as described previously. The electrical field vector associated with a probe is aligned with the long axis (probiscus 18 or 19) of the probe. The electrical field vector associated with an iris is at a 90° angle with respect to the long axis of the iris, and is in the same plane as the iris.

For illustration purposes only, port 4 is shown in FIG. 3 as being a coaxial coupler having a cylindrical-sleeve-shaped outer conductor 16, a dielectric mounting plate 17, and an inner conductive probiscus 18 extending orthogonally into cavity 12. Port 5 is shown as a capacitive probe having a conductive probiscus 19 extending orthogonally into cavity 12; the probiscus 19 is shielded from conductive wall 40 by dielectric sleeve 24. Port 5 is disposed 90° circumferentially away from port 4 along sidewall 40. Port 6 and optional port 7 are depicted as being irises. It matters not which endwall 15 port 6 is cut into (compare FIGS. 3 and 4) as long as the electrical field vector associated with port 6 is aligned with a characterizing vector of mode 1, as described previously; port 7, if present, is cut into the opposite endwall 15 from port 6.

Tuning and coupling screws 44, 46, and 48 protrude through sidewall 40 for frequency tuning and determining the degree of coupling between the orthogonal modes 1, 2, as more fully described below.

Cavity 12 can have therewithin a dielectric resonator 20, preferably having a high dielectric constant and a high Q. The dielectric resonator 20 allows for a physical shrinking of cavity 12 while retaining the same electromagnetic characteristics of cavity 12; this is important in applications where weight and size are critical, e.g., in spacecraft.

When dielectric resonator 20 is not used, each of the two orthogonal modes 1 and 2 is a $TE_{11p}$ mode, where p is any positive integer. Where dielectric resonator 20 is used, the modes 1 and 2 are degenerative modes known as $HE_{11\delta}$ modes.

Figure 5:
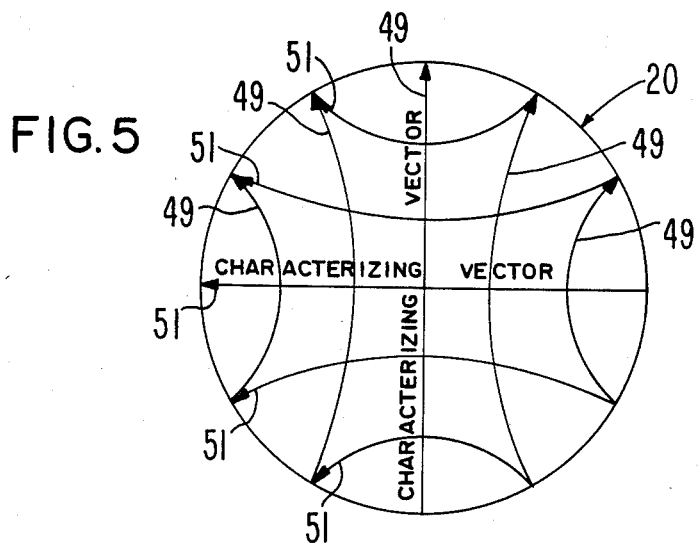
FIG. 5 is a sketch showing the electrical field distribution within optional dielectric resonator 20 employed in cavity 12 of the present invention.

FIG. 5 illustrates a cross-section of a dielectric resonator 20, in a plane orthogonal to sidewall 40, showing the two orthogonal modes 1 and 2 resonating therewithin. Mode 1 is designated by arrows 49 showing the distribution of the electrical field of mode 1. Mode 2 is designated by arrows 51 showing the electrical field distribution of mode 2. Characterizing vectors of the modes 1, 2 are identified.

When resonator 20 is employed, the midpoint of resonator 20 does not have to be situated halfway along the longitudinal axis of cavity 12. However, in any plane orthogonal to sidewall 40 and bifurcating both cavity 12 and resonator 20, the shape of the resonator 20 cross-section and the cavity 12 cross-section should be the same (the size of the resonator 20 cross-section will of course be less than or equal to that of the cavity 12 cross-section), and the resonator 20 cross-section should be centered within the cavity 12 cross-section. The resonator 20 cross-section and the cavity 12 cross-section should both satisfy the rule that their common shape must remain unchanged following rotation in such a plane by an integral multiple of 90°. Thus, this common shape can be a circle, square, octogon, etc. Resonator 20 is kept in place within cavity 12 by a material having a low dielectric constant, such as styrofoam, by a metal or dielectric screw, or by other means.

Such dielectric resonators 20 are more fully described in U.S. patent application Ser. Nos. 425,015 filed Sept. 27, 1982, and 466,180 filed Feb. 14, 1983, each having the same inventor and same assignee as the instant patent application.

In FIG. 4, each of ports 4 and 5 is shown as being a capacitive probe, having an elongated electrically conductive probiscus 19 extending orthogonally into cavity 12 from the external transmission medium, insulated from the electrically conductive sidewall 40 by means of a cylindrical dielectric sleeve 24 surrounding probiscus 19. Capacitive probe 5 is disposed 90° circumferentially away from probe 4 along sidewall 40.

The length of a probiscus 18 or 19 is dependent upon the desired electrical characteristics. As one lengthens probiscus 18 or 19, the bandwidth of the passband of the pole associated with the mode coupled by the probe increases, and vice versa. The exact length of probiscus 18 or 19 is determined experimentally.

Similarly, the width of an iris depends upon the desired electrical characteristics. The wider the iris, the wider the bandwidth of the filter function associated with the mode coupled by the iris.

With respect to FIG. 3, tuning means 44 and 48 are each orthogonal to sidewall 40 and colinear with a characterizing vector of one of the two orthogonal modes 1, 2. Tuning means 44, 48 can be dielectric or conductive screws; each perturbs the electrical field of the mode with whose characterizing vector the screw is aligned, thus changing the frequency of that mode. This perturbation could be accomplished by other means, e.g., by indenting sidewall 40 at the point where the screw 44, 48 would enter. Inserting the screw 44, 48 further into cavity 12 lowers the resonant frequency of the associated mode.

Coupling perturbation means 46, typically a dielectric or conductive screw orthogonal to sidewall 40 and penetrating cavity 12, controls the degree of coupling between orthogonal modes 1 and 2. The more one inserts coupling screw 46 into cavity 12, the more one excites the derivative mode (in this case, mode 2). Since screws can cause unwanted microphonics, screw 46 can be replaced by a pretuned notch in dielectric resonator 20 when the latter is used. In any case, coupling perturbation means 46 should be adjusted to sustain oscillation and to optimize the output power of the oscillator 30 as desired.

FIG. 3 shows the penetration points of all the screws 44, 46, 48 being the same distance along the longitudinal axis of cavity 12, but this is not necessary.

In FIG. 4, mechanical tuning means 44 and 48 have been replaced by varactor diodes 10 corresponding to the electronic frequency tuning embodiment of the invention depicted in FIG. 2. The cathode of each diode 10 is grounded to sidewall 40. The anode of each diode 10 is connected to wire 25, and thence to the output of phase/frequency comparator 11.

The above description is included to illustrate the operation of the preferred embodiments and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. An electromagnetic oscillator having an output conveying a stable a.c. waveform, comprising:

a cavity having at least three ports and having electrically conductive walls, within which resonate first and second orthogonal modes of electromagnetic energy; and an amplifying element having an input and an output;

wherein the output of the amplifying element is excitationally coupled to the first orthogonal mode at a first port of the cavity;

at a second port of the cavity, the second orthogonal mode is coupled to the input of the amplifying element;

at a third port of the cavity, the first orthogonal mode is coupled to the output of the oscillator; and a stable a.c. reference is injected into the cavity at a fourth port thereof, the electrical field vector of the stable a.c. reference being aligned with a characterizing vector of the second orthogonal mode.

2. An electromagnetic oscillator having an output conveying a stable a.c. waveform, comprising:

a cavity having at least three ports and having electrically conductive walls, within which resonate first and second orthogonal modes of electromagnetic energy; and an amplifying element having an input and an output;

wherein the output of the amplifying element is excitationally coupled to the first orthogonal mode at a first port of the cavity;

at a second port of the cavity, the second orthogonal mode is coupled to the input of the amplifying element; and at a third port of the cavity, the first orthogonal mode is coupled to the output of the oscillator;

said oscillator further comprising means for electronically tuning the frequency of the oscillator, said tuning means comprising:

a phase/frequency comparator having a first input coupled to the output of the oscillator, a second input coupled to a reference a.c. source, and an output coupled to frequency varying means coupled to the cavity at a fourth port thereof.

3. The oscillator of claim 2 wherein the frequency varying means comprises at least one varactor diode, each varactor diode being mounted within the cavity at the origin of a characterizing vector of one of the orthogonal modes.

4. An electromagnetic oscillator having an output conveying a stable a.c. waveform, comprising:

a cavity having at least three ports and having electrically conductive walls, within which resonate first and second orthogonal modes of electromagnetic energy; and an amplifying element having an input and an output;

wherein the output of the amplifying element is excitationally coupled to the first orthogonal mode at a first port of the cavity;

a second port of the cavity, the second orthogonal mode is coupled to the input of the amplifying element; and at a third port of the cavity, the first orthogonal mode is coupled to the output of the oscillator;

said oscillator further comprising, positioned within the cavity, dielectric means for allowing physical shrinking of the cavity while preserving the cavity's electromagnetic characteristics;

wherein the orthogonal modes are degenerative $HE_{11\delta}$ modes.

5. The oscillator of claim 4 wherein the cavity is generally elongated along a longitudinal axis; and in any plane which is orthogonal to the longitudinal axis and bifurcates both the allowing means and the cavity, the cross-section of the allowing means has substantially the same shape as the cavity's cross-section;

within said plane, the center of the cross-section of the allowing means coincides with the center of the cavity's cross-section; and within said plane, the shape of the cavity's cross-section remains constant following rotation by any integral multiple of 90°.

* * * * *